US007778344B2

(12) United States Patent
Gai

(10) Patent No.: US 7,778,344 B2
(45) Date of Patent: Aug. 17, 2010

(54) SYSTEM AND METHOD FOR COMBINING A PLURALITY OF SIGNALS OF VARIOUS PHASES HAVING A WIDE FREQUENCY RANGE

(75) Inventor: Weixin Gai, San Jose, CA (US)

(73) Assignee: Fujitsu Limited, Kawasaki (JP)

( * ) Notice: Subject to any disclaimer, the term of this patent is extended or adjusted under 35 U.S.C. 154(b) by 822 days.

(21) Appl. No.: 11/420,391

(22) Filed: May 25, 2006

(65) Prior Publication Data

US 2007/0274413 A1 Nov. 29, 2007

(51) Int. Cl.
*H04L 27/10* (2006.01)

(52) U.S. Cl. ....................... 375/280; 375/214; 375/294; 375/327; 375/332; 375/373; 375/376

(58) Field of Classification Search ................. 375/280, 375/214, 294, 327, 332, 373, 376
See application file for complete search history.

(56) References Cited

U.S. PATENT DOCUMENTS

2003/0122596 A1* 7/2003 Saeki ......................... 327/127
2005/0270210 A1* 12/2005 Arslan ........................ 341/155

* cited by examiner

*Primary Examiner*—Shuwang Liu
*Assistant Examiner*—Kabir A Timory
(74) *Attorney, Agent, or Firm*—Baker Botts L.L.P.

(57) ABSTRACT

A system for combining a plurality of signals of various phases having a wide frequency range includes a signal transmuter configured to receive a plurality of input signals of different phases. The signal transmuter is also configured to generate at least one output signal based on one or more of the input signals. The system also includes at least one switch configured to receive a control signal and operable to selectively couple at least one associated capacitor to the at least one output signal. The coupling is such that the capacitor is coupled to the at least one output signal when the switch is closed. The control signal is set to substantially reduce the saturation of the at least one output signal.

16 Claims, 4 Drawing Sheets

410
420
430
VOLTAGE
200m
0
-200m
45n
46n
47n
48n
49n
50n
TIME 440
450
460
VOLTAGE
500m
0
-500m
45n
46n
47n
48n
49n
50n
TIME

SYSTEM AND METHOD FOR COMBINING A PLURALITY OF SIGNALS OF VARIOUS PHASES HAVING A WIDE FREQUENCY RANGE

TECHNICAL FIELD OF THE INVENTION

This invention relates in general to circuit design and, more particularly, to a system and method for combining a plurality of signals of various phases having a wide frequency range.

BACKGROUND OF THE INVENTION

Various devices exist for combining signals of different phases in order to produce an output signal having a particular phase. For example, one common device is a phase interpolator that outputs a clock signal with a desired phase by combining one or more clock signals of varying phase based on an inputted weight associated with each phase. However, a problem with signal saturation arises when the phase interpolator needs to be able to accept inputs with a wide range of frequencies (as an example, inputs between 5 GHz and 500 MHz). The lower the input frequency drops the worse the saturation may become. A common solution is to configure the phase interpolator to work at the highest required frequency, and then use some combination of frequency dividers and selectors to generate the desired lower frequencies. The addition of the frequency dividers and selectors increases both the power consumption and overall size of the circuit. Furthermore, at very high frequencies (for example, around 5 GHz) it becomes significantly more difficult to design high-speed frequency dividers and selectors. Additionally, even when the required output has a very low frequency (for example, one-tenth of the highest frequency) the phase interpolator still needs to work at the highest frequency, which may not be desirable in a low-power design.

SUMMARY OF THE INVENTION

The present invention provides a system and method for combining a plurality of signals of various phases having a wide frequency range that substantially eliminates or reduces at least some of the disadvantages and problems associated with previous methods and systems.

In accordance with a particular embodiment, a system for combining a plurality of signals of various phases having a wide frequency range, includes a signal transmuter configured to receive a plurality of input signals of different phases. The signal transmuter is also configured to generate at least one output signal based on one or more of the plurality of input signals. The system also includes one or more switches selectively coupling one or more associated capacitors to the at least one output signal such that when the one or more switches is closed its one or more associated capacitors is coupled to the at least one output signal. Furthermore, the one or more switches are configured to receive a control signal to selectively open or close the one or more switches. The value of the control signal is selected to control the saturation of the at least one output signal through the coupling of one or more of the capacitors to the at least one output signal.

In particular embodiments the plurality of input signals of different phases may include clock signals of different phases. In some embodiments the frequency of the plurality of input signals may vary between a first frequency and a second frequency, the second frequency is at least ten times the first frequency.

In some embodiments the signal transmuter may be a phase interpolator. In particular embodiments the signal transmuter may be optimized to perform at the second frequency.

In particular embodiments the switches may have a low resistance. In some embodiments the switches may include 2.5 volt switches.

In some embodiments the one or more switches selectively coupling one or more associated capacitors to the at least one output signal may include a plurality of switches configured to receive a control signal and operable to selectively couple one or more associated capacitors to the at least one output signal. Each switch of the plurality of switches may be capable of being switched independent of the other switches to selectively couple its associated one or more capacitors to the at least one output signal. In particular embodiments each switch, and its one or more associated capacitors, is in parallel with at least one other switch of the one or more switches, and its one or more associated capacitors.

Technical advantages of particular embodiments include allowing for signal transmutation of signals having a wide range of frequencies without having to design or use a high-speed frequency divider or selector. Accordingly, signal transmutation may be achieved over a wide frequency range using less power and less space than comparable signal transmutation in which a frequency divider and selector are used.

Other technical advantages will be readily apparent to one skilled in the art from the following figures, descriptions and claims. Moreover, while specific advantages have been enumerated above, various embodiments may include all, some or none of the enumerated advantages.

BRIEF DESCRIPTION OF THE DRAWINGS

For a more complete understanding of the present invention and its advantages, reference is now made to the following description, taken in conjunction with the accompanying drawings, in which.

DETAILED DESCRIPTION

Figures 1, 2:
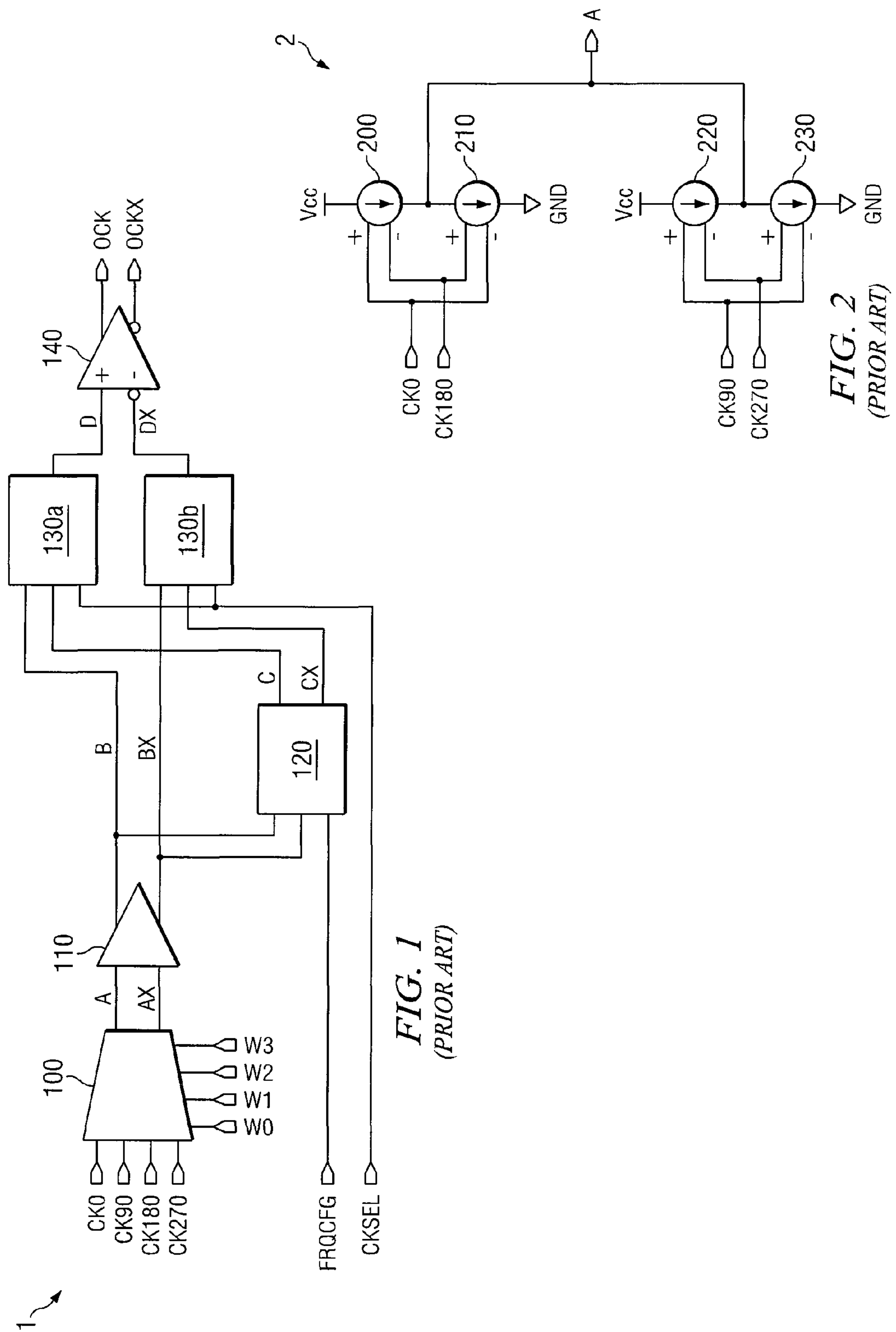
FIG. 1 illustrates a typical circuit design for implementing phase interpolation.
FIG. 2 illustrates a mixer portion of a typical circuit design for an interpolator.

FIGS. 1 and 2 illustrate typical circuit designs for implementing signal transmutation using a phase interpolator. A phase interpolator is just one kind of signal transmuter, a signal transmuter may be any component or circuit design that combines, mixes, or otherwise uses input signals of different phases to generate an output signal having a desired phase. FIGS. 1 and 2 are presented as background to provide a basis for comparisons with particular embodiments of the present invention, for example, with the embodiment depicted in FIG. 3, to help illustrate some of the features and benefits of particular embodiments of the present invention.

FIG. 1 depicts circuit 1 having a phase interpolator 100, an amplifier 110, a frequency divider 120, selectors 130a and 130b and a buffer 140. In the illustrated example, phase interpolator 100 (an exemplary signal transmuter) receives four input clock signals, CK0, CK90, CK180, and CK270, having four different phases spaced at 90 degree intervals (e.g., CK0 may be shifted 0°, CK90 may be shifted 90°, CK180 may be shifted 180°, and CK270 may be shifted 270°). Phase interpolator 100 uses these input clock signals to generate clock signals A and AX having a desired phase. It should be noted that where a pair of signals are labeled <Signal> and <Signal>X, the pair of signals are differential signals, the signal labeled <Signal>X is the inverse or opposite of the signal labeled <Signal>. While interpolator 100 is depicted as having two clock signals A and AX, some interpolators may have only one clock signal (the differential signals are not required).

The phase of clock signals A and AX may be based on a combination of clock signals CK0, CK90, CK180, and CK270. The combination may be determined by a phase weight signal received by interpolator 100 via phase weight inputs W0-W3. Clock signals A and AX may pass through amplifier 110 where the signal is amplified and outputted as clock signals B and BX respectively. Clock signals B and BX then pass through both frequency divider 120 and one of selectors 130a or 130b. Also connected to frequency divider 120 is input FRQCFG. Frequency divider 120 may take the high frequency clock signals B and BX and reduce it to a lower frequency (as selected by input FRQCFG) and output it via clock signals C and CX, respectively. Clock signals C and CX as well as clock signals B and BX are connected to selectors 130a and 130b respectively. Input CKSEL is input to both selectors 130a and 130b and may be used to select the desired output from either the higher frequency (clock signals B and BX) or the lower frequency (clock signals C and CX) and output the selected signal as clock signals D and DX, respectively. Clock signals D and DX from selectors 130a and 130b, respectively, are then passed through buffer 140 where, after some delay, they are ultimately outputted as output clock signals OCK and OCKX having the desired phase and frequency.

Phase interpolator 100 may be optimized to interpolate clock signals CK0, CK90, CK180, and CK270 when clock signals CK0, CK90, CK180, and CK270 are of a certain frequency. However, the farther below this optimum frequency clock signals CK0, CK90, CK180, and CK270 are, the more saturated clock signals A and AX may become. Thus, in order to have a system that can generate an output signal having a wide range of frequencies without saturation, interpolator 100 may be optimized to work at the highest desired frequency while additional components are used to create the output clock signals OCK or OCKX having the desired lower frequency. To this end, frequency divider 120 and selectors 130a and 130b, are used to create the desired lower frequency from the higher frequency signal outputted by interpolator 100. This has several disadvantages, such as requiring additional power and space because of the added components, and decreasing system efficiency because of having to continuously run interpolator 100 and clock signals CK0, CK90, CK180, and CK270 at the highest desired frequency.

FIG. 2 illustrates a mixer portion 2 of a typical circuit design for an interpolator, such as interpolator 100 of FIG. 1. The depicted circuit shows, in more detail, how clock signal A (of interpolator 100) is generated. More specifically, the phase of clock signal A is determined by the weight given to current sources 200-230 (for example, by weight inputs W0-W3 of interpolator 100). For example, if the weight of current sources 200 and 210 is 1 while the weight of current sources 220 and 230 is 0, the phase of clock signal A may match input CK0, and if the weight of current sources 200 and 210 is 0 while the weight of current sources 220 and 230 is 1, the phase of clock signal A may match input CK90. If current source 200-230 were to all have the same weight then clock signal A may be a clock signal having a phase in-between CK0 and CK90 (if CK0 is a clock signal having a 0° phase shift and CK90 is CK0 phase shifted 90°, then A would be CK0 phase shifted 45°). Thus, mixer 2 details how clock signal A, generated by interpolator 100, has the same frequency as clock signal CK0, phase shifted by an amount determined by phase weight inputs W0-W3.

It should be noted that the circuit design depicted in FIG. 2 is only one of the possible circuit designs that may be used in transmuting a plurality of signals of different phases into a single signal having a desired phase. Many other circuit designs may exist that can perform this transmutation, and which experience some level of saturation, thus requiring a system that reduces or eliminates the amount of saturation in the outputted signal.

Figure 3:
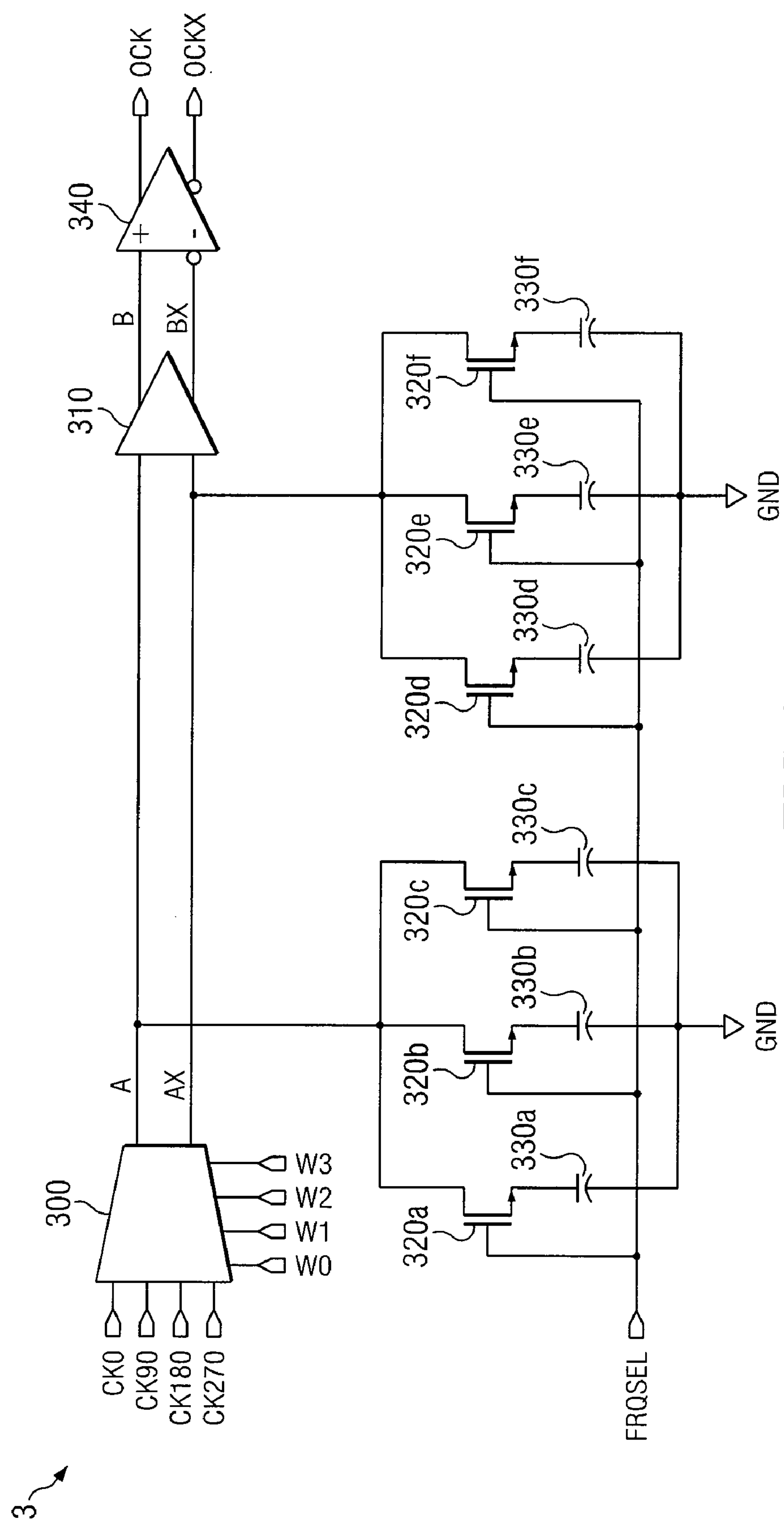
FIG. 3 illustrates a circuit design for implementing phase interpolation with a wide frequency range in accordance with a particular embodiment of the present invention.

FIG. 3 illustrates circuit 3, a circuit designed for implementing phase interpolation with a wide frequency range in accordance with a particular embodiment of the present invention. Circuit 3 includes an interpolator 300, an amplifier 310, switches 320a-320f, capacitors 330a-330f and a buffer 340. Other embodiments may include other types of signal transmuters (or other interpolator circuit designs). These components are coupled to one another such that circuit 3 may allow phase interpolation of a relatively wider range of frequencies and may use less power and take up less space than previous designs, such as circuit 1 of FIG. 1.

Like phase interpolator 100, phase interpolator 300 has four clock signals, CK0, CK90, CK180, and CK270, having four different phases spaced at 90 degree intervals (e.g., CK0 may be shifted 0°, CK90 may be shifted 90°, CK180 may be shifted 180°, and CK270 may be shifted 270°). Although four clock signals with a 90° phase difference are used in the illustrated example, any suitable number and phase of clock signals may be used. While the frequency of clock signals CK0, CK90, CK180, and CK270 used with interpolator 100 was limited to the highest desired frequency (the frequency for which interpolator 100 was optimized), the frequency of clock signals CK0, CK90, CK180, and CK270 used with interpolator 300 may vary over a relatively wide range depending on the particular application. In particular embodiments the range of frequencies for clock signals CK0, CK90, CK180, and CK270 may be such that the higher frequency is ten times (or more) the lower frequency. For example, and not by way of limitation, in particular embodiments the frequency of clock signals CK0, CK90, CK180, and CK270 may range from 500 MHz to 5 GHz. Thus, clock signals CK0, CK90, CK180, and CK270 may themselves be reduced to the lower desired frequency, rather than relying on additional components to reduce the higher frequency (for which the interpolator is optimized) to the lower desired frequency. This is because saturation that may be generated by interpolator 300 may be corrected by the capacitance that is selectively coupled clock signals A and AX of interpolator 300 via an arrangement of switches 320 and capacitors 330 as discussed in more detail below.

Like clock signals A and AX of interpolator 100, clock signals A and AX of phase interpolator 300 are based on a combination of clock signals CK0, CK90, CK180, and CK270. The combination may be determined by a phase weight signal received by interpolator 300 via phase weight inputs W0-W3. Clock signals A and AX may pass through amplifier 310 where the signal is amplified and outputted as clock signals B and BX, respectively. Any saturation that may occur at the output of interpolator 300 is prevented by selecting the appropriate amount of capacitance to couple to clock signals A and AX, thus providing amplifier 310 with a signal that may have little or no saturation. It should be noted that circuit 3 does not include any frequency dividers or selectors, unlike circuit 1.

The amount of capacitance that is needed may be related to the difference between the higher optimized frequency and the lower desired frequency. In particular embodiments, once the needed amount of capacitance is known it may be coupled to clock signal A or AX via the arrangement of switches 320 and capacitors 330 depicted in FIG. 3. More specifically, in the example illustrated embodiment, coupled to clock signal A may be switches 320*a*-320*c* and capacitors 330*a*-330*c*, and similarly coupled to clock signal AX may be switches 320*d*-320*f* and capacitors 330*d*-330*f*. Although a particular number of switches and capacitors are shown as an example, any suitable number may be used. Switches 320*a*-320*f* are coupled in series with capacitors 330*a*-330*f*, respectively, forming six capacitor-switch pairs (which are coupled in parallel). The capacitor-switch pairs may be configured such that when any of switches 320 are closed the respective capacitor 330 is effectively coupled to clock signal A or AX, and conversely when any of switches 320 are open the respective capacitor 330 is effectively disconnected from clock signal A or AX. For example, if switches 320 *a, b, d* and *e* were closed and switches 320 *c*, and *f* were open then the capacitance coupled to clock signal A would be the capacitance of capacitor 330*a* plus the capacitance of capacitor 330*b*, and the capacitance coupled to clock signal AX would be the capacitance of capacitor 330*d* plus the capacitance of capacitor 330*e*. Switches 320 may be low resistance switches to increase the effectiveness of capacitors 330. For example, and not by way of limitation, in some embodiments interpolator 300 may be a 1.2 volt (1.2V) device (the output voltage of A and AX may not exceed 1.2V) and switches 320*a*-320*f* may be 2.5 volt (2.5V) nmos switches. The resistance of such switches may be kept relatively low (compared to typical low voltage devices, such as 1.2V devices) due to the higher turn-on voltage of a 2.5V nmos switch. By using 2.5V switches in a 1.2V system the voltage at capacitors 330*a*-330*f* may be greater than if 1.2V switches had been used.

Switches 320 are controlled by input FRQSEL. Input FRQSEL may be a bus comprised of 6 input lines, with each line coupled to a different switch. Thus, each switch may individually be closed or opened based on the signal of input FRQSEL. This allows for a number of different values of capacitance to be coupled to each output of interpolator 300. The signal of input FRQSEL may be based on the desired frequency of outputs OCK or OCKX and/or the amount of capacitance that is to be coupled to clock signals A and AX. The lower the desired frequency is from the frequency at which interpolator 300 is optimized, the greater the capacitance may need to be in order to eliminate or reduce the saturation. This can be seen in FIGS. 4A-5B, discussed below, which illustrate the effects of using different frequencies and capacitances.

The value of each capacitor 330*a*-330*f* may vary (based on system needs, costs etc.) from application to application, and may vary within a particular application. For example, in one application the capacitance of capacitors 330 may be equal and in another application the capacitance of one or more capacitors 330 may be unique. Furthermore, other embodiments may employ more or less capacitor-switch pairs to provide more or less granularity in the amount of capacitance that is used.

The selected capacitance is applied to signals A and AX (reducing and/or eliminating any saturation therein) prior to signals A and AX being amplified by amplifier 310. The non-saturated, amplified clock signal B and BX then passes through buffer 340 before it is finally outputted as output OCK and OCKX. Outputs OCK and/or OCKX may have the desired phase and frequency, with little to no saturation.

Although the present invention has been described in detail with reference to particular embodiments, it should be understood that various other changes, substitutions, and alterations may be made hereto without departing from the spirit and scope of the present invention. For example, switches 320 and capacitors 330 paired together in FIG. 3, may be arranged such that the capacitors are connected in series and would thus add reciprocally. Alternatively, the capacitor-switch pairs may all be replaced by a one or more capacitors having an adjustable/selectable capacitance. The present invention contemplates great flexibility in the arrangement of these elements as well as their internal components. It should also be noted that phase interpolator 300 may be replaced with other signal transmuters that may combine signals of different phases and/or that lie within a wide range of frequencies in which part of that range may become saturated.

FIGS. 4A-5B depict example waveforms associated with the circuit design of FIG. 3 that may result from having different frequencies and different capacitances coupled to the output of interpolator 300 of FIG. 3. The numbers shown along the X-Y axis in each waveform are for reference purposes only and are not intended to limit in any way the capacitance, frequency and/or peak voltage that may be used with particular embodiments of the present invention. In all four figures the waveforms are those measured from clock signal A of interpolator 300. Each Figure comprises a set of three waveforms with the top most waveform (410, 440, 510 and 540) depicting a triangle-waveform clock signal with a 0 degree phase shift; the middle waveform (420, 450, 520 and 550) depicting a triangle-waveform clock signal with a 90 degree phase shift; and the bottom most waveform (430, 460, 530, and 560) depicting the result of interpolating the top most waveform with the middle waveform.

Figure 4A:
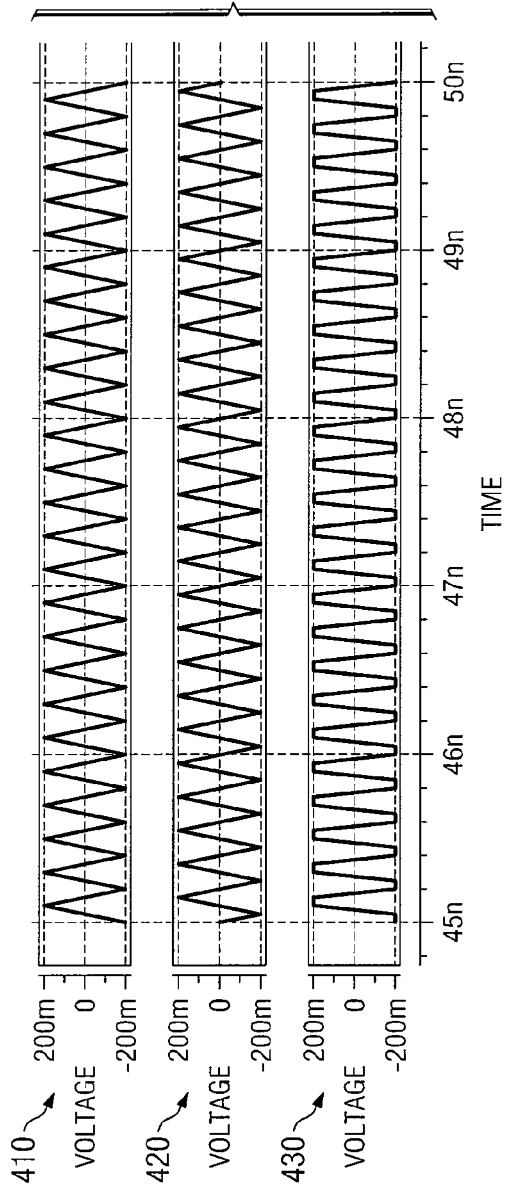
FIG. 4A depicts example waveforms associated with the circuit design of FIG. 3 for an output having a relatively high frequency while being coupled to a relatively low capacitance.
Figure 4B:
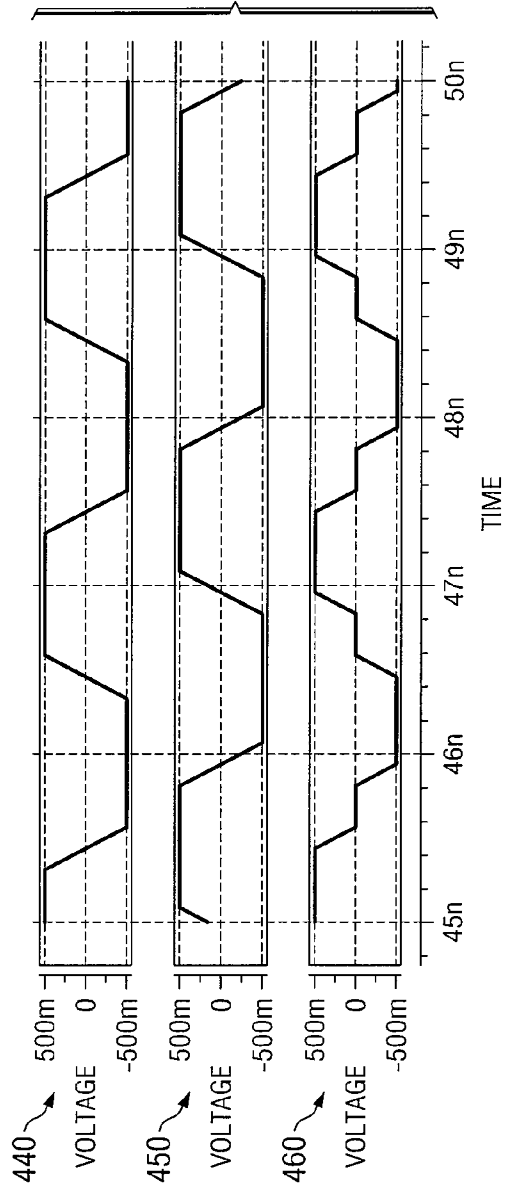
FIG. 4B depicts example waveforms associated with the circuit design of FIG. 3 for an output having a relatively low frequency while being coupled to a relatively low capacitance.

There is a variation between FIGS. 4A and 4B and FIGS. 5A and 5B in the amount of capacitance coupled to clock signal A. In FIGS. 4A and 4B the waveforms are based on the output of interpolator 300 being coupled to 0.05 picofarads, while in FIGS. 5A and 5B the waveforms are based on the output of interpolator 300 being coupled to 0.2 picofarads. The capacitance coupled to clock signal A may be from a single capacitor or it may be from multiple capacitors, depending, in part, on the capacitance of each capacitor and which capacitors are coupled to the output based on input FRQSEL.

FIG. 4A depicts the waveforms associated with an output having a relatively high frequency, for example 5 GHz, while being coupled to a relatively low capacitance, for example 0.05 picofarads. It should be noted that none of the waveforms show any saturation. This demonstrates that when interpolator 300 is optimized for a high frequency and the inputs are running at that high frequency, then the output may not be saturated and a large capacitance may not be needed.

FIG. 4B depicts the waveforms associated with an output having a relatively low frequency, for example 500 MHz, while being coupled to a relatively low capacitance, for example 0.05 picofarads. The frequency in the waveforms of FIG. 4B is one-tenth the frequency of the waveforms of FIG. 4A, and as a result the output of interpolator 300 has become saturated, as can be seen by the horizontal sections of waveforms 440, 450 and portions of 460. This may indicate that the interpolator may not be optimized to be run at this frequency, and/or that the capacitance coupled to the output may not be high enough.

Figure 5A:
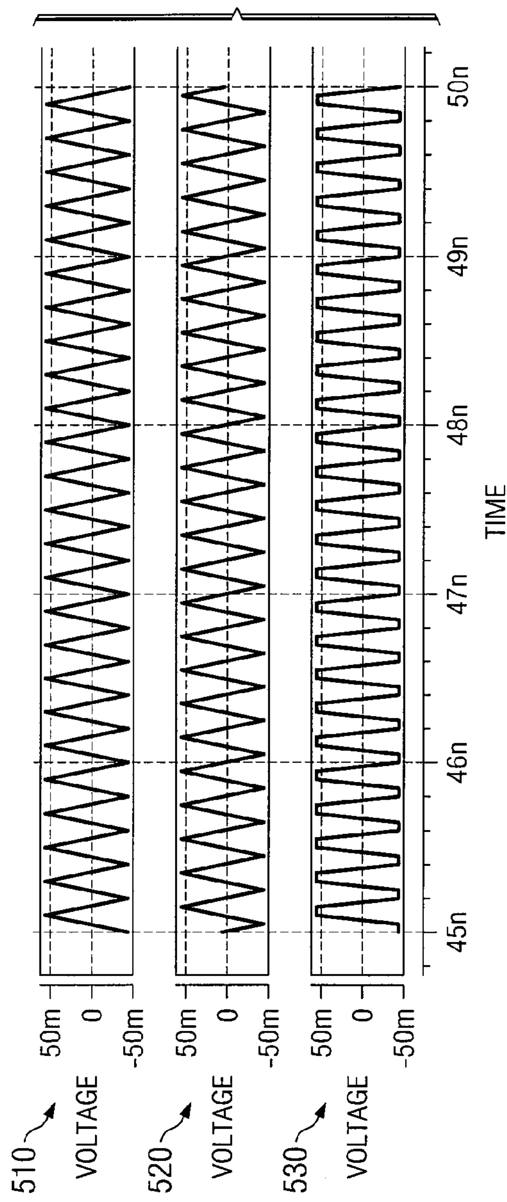
FIG. 5A depicts example waveforms associated with the circuit design of FIG. 3 for an output having a relatively high frequency while being coupled to a relatively high capacitance.

FIG. 5A depicts the waveforms associated with an output having a relatively high frequency, for example 5 GHz, while being coupled to a relatively high capacitance, for example 0.2 picofarads. These waveforms have the same frequency as the waveforms depicted in FIG. 4A and thus, while there is a large capacitance coupled to output A, it may not be needed because at this higher frequency the output of the interpolator may not be saturated. It should be noted that in FIG. 5A the amplitude of the waveforms is relatively small to prevent introducing large jitter with such a high frequency signal.

Figure 5B:
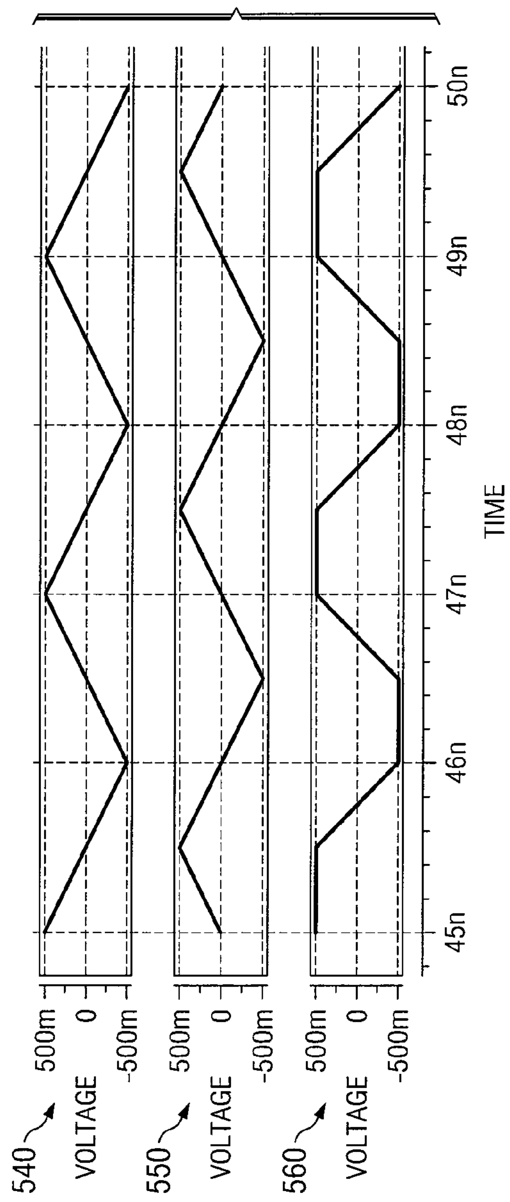
FIG. 5B depicts example waveforms associated with the circuit design of FIG. 3 for an output having a relatively low frequency while being coupled to a relatively high capacitance.

FIG. 5B depicts the waveforms associated with an output having a relatively low frequency, for example 500 MHz, while being coupled to a relatively high capacitance, for example 0.2 picofarads. The frequency of the waveforms in FIG. 5B is one-tenth the frequency of the waveforms of FIG. 5A, however, because of the increased capacitance (as compared to the capacitance used in FIG. 4B) attached to output A waveform 560 has not become saturated (the flat portions of waveform 560 are the proper interpolated result) as it did in FIG. 4B, thus indicating that the proper amount of capacitance has been added to output A to properly correct the saturation of the interpolator.

Numerous other changes, substitutions, variations, alterations and modifications may be ascertained by those skilled in the art and it is intended that the present invention encompass all such changes, substitutions, variations, alterations and modifications as falling within the spirit and scope of the appended claims.

What is claimed is:

1. A system for combining a plurality of signals of various phases having a wide frequency range, comprising:

a signal transmuter optimized to operate at a first frequency and configured to:

receive a first plurality of input signals of different phases, the first plurality of input signals having a second frequency wherein the first frequency is at least ten times greater than the second frequency; and generate at least one output signal based on one or more of the first plurality of input signals, the first plurality of input signals and the at least one output signal having a first voltage less than a second voltage;

one or more switches having a turn-on voltage greater than the second voltage and selectively coupling one or more associated capacitors to the at least one output signal such that when the one or more switches is closed the one or more capacitors associated with the one or more closed switches are coupled to the at least one output signal; and a signal generator configured to set a first value of a control signal to inhibit saturation of the at least one output signal, the first value of the control signal associated with a first amount of capacitance based on a difference between the first frequency and the second frequency, wherein:

upon the signal transmuter receiving a second plurality of input signals of a third frequency less than the second frequency, the signal generator is further configured to set a second value of the control signal to inhibit saturation of the at least one output signal, the second value of the control signal associated with a second amount of capacitance less than the first amount of capacitance and based on a difference between the first frequency and the third frequency; and upon the signal transmuter receiving a third plurality of input signals of a fourth frequency greater than the second frequency, the signal generator is further configured to set a third value of the control signal to inhibit saturation of the at least one output signal, the third value of the control signal associated with a third amount of capacitance greater than the first amount of capacitance and based on a difference between the first frequency and the fourth frequency;

wherein the one or more switches are configured to receive the control signal to selectively open or close the one or more switches based on the first value of the control signal.

2. The system of claim 1, wherein the first, second, and third plurality of input signals of different phases comprises a first, second, and third plurality of clock signals of different phases.

3. The system of claim 1, wherein the signal transmuter comprises a phase interpolator.

4. The system of claim 1, wherein the one or more switches comprises switches having a low resistance.

5. The system of claim 1, wherein the one or more switches comprises 2.5 volt switches.

6. The system of claim 1, wherein the one or more switches selectively coupling one or more associated capacitors to the at least one output signal comprises a plurality of switches configured to receive a control signal and operable to selectively couple one or more associated capacitors to the at least one output signal, each switch of the plurality of switches capable of being switched independent of the other switches to selectively couple its associated one or more capacitors to the at least one output signal.

7. The system of claim 1, wherein each switch of the one or more switches, and its one or more associated capacitors, is in parallel with at least one other switch of the one or more switches, and its one or more associated capacitors.

8. A method for combining a plurality of signals of various phases having a wide frequency range, comprising:

receiving, at a signal transmuter optimized to operate at a first frequency, a first plurality of input signals of a second frequency comprising a plurality of different phases, wherein the first frequency is at least ten times greater than the second frequency;

setting a first value of a control signal to inhibit saturation of at least one output signal, the first value of the control signal associated with a first amount of capacitance based on a difference between the first frequency and the second frequency;

generating the at least one output signal based on one or more of the first plurality of input signals, the first plurality of input signals and the at least one output signal having a first voltage less than a second voltage;

receiving the control signal at one or more switches having a turn-on voltage greater than the second voltage;

selectively coupling one or more associated capacitors to the at least one output signal when the one or more switches are closed, wherein the one or more switches are selectively opened or closed based on the first value of the control signal generating a non-saturated transmuted signal having a particular phase;

upon receiving at the signal transmuter a second plurality of input signals of a third frequency less than the second frequency, setting a second value of the control signal to inhibit saturation of the at least one output signal, the second value of the control signal associated with a second amount of capacitance less than the first amount of capacitance and based on a difference between the first frequency and the third frequency; and upon receiving at the signal transmuter a third plurality of input signals of a fourth frequency greater than the second frequency, setting a third value of the control signal to inhibit saturation of the at least one output signal, the third value of the control signal associated with a third amount of capacitance greater than the first amount of capacitance and based on a difference between the first frequency and the fourth frequency.

9. The method of claim 8, wherein receiving a first, second, and third plurality of input signals of different phases comprises receiving a first, second, and third plurality of clock signals of different phases.

10. The method of claim 8, wherein the signal transmuter comprises a phase interpolator.

11. The method of claim 8, wherein the one or more switches comprises switches having a low resistance.

12. The method of claim 8, wherein the one or more switches comprises 2.5 volt switches.

13. The method of claim 8, wherein selectively coupling one or more capacitors to the at least one output signal when the one or more switches are closed comprises selectively coupling one or more capacitors to the at least one output signal when one of a plurality of switches are closed, each switch of the plurality of switches being closed independently of the other switches of the plurality of switches to selectively couple its associated one or more capacitors to the at least one output signal.

14. The method of claim 8, wherein each switch of the one or more switches, and its one or more associated capacitors, is in parallel with at least one other switch of the one or more switches, and its one or more associated capacitors.

15. The method of claim 8, wherein:

generating at least one output signal comprises generating two output signals based on one or more of the first, second, or third plurality of input signals, the first, second, and third plurality of input signals and the at least one output signal having a first voltage less than a second voltage; and selectively coupling one or more associated capacitors to the at least one output signal comprises separately and selectively coupling two or more associated capacitors to the two output signals such that a substantially equal amount of capacitance is separately coupled to each of the two output signals.

16. A method for combining a plurality of signals of various phases having a wide frequency range, comprising:

receiving, at a signal transmuter optimized to operate at a first frequency, a plurality of input signals of a second frequency comprising a plurality of different phases, wherein the first frequency is at least ten times greater than the second frequency;

setting a value of a control signal to inhibit saturation of the at least one output signal based on a difference between the first frequency and the second frequency, the value of the control signal is associated with an amount of capacitance, wherein the value of the control signal is set such that the larger the difference is between the first frequency and the second frequency, the larger the amount of capacitance is that is associated with the control signal;

receiving the control signal at one or more switches, generating at least one output signal based on one or more of the plurality of input signals;

selectively coupling one or more associated capacitors to the at least one output signal when the one or more switches are closed, wherein the one or more switches are selectively opened or closed based on the value of the control signal; and generating a non-saturated transmuted signal having a particular phase.

* * * * *